(12) United States Patent
Loh et al.

(10) Patent No.: US 7,939,842 B2
(45) Date of Patent: *May 10, 2011

(54) LIGHT EMITTING DEVICE PACKAGES, LIGHT EMITTING DIODE (LED) PACKAGES AND RELATED METHODS

(75) Inventors: Ban P. Loh, Durham, NC (US); Peter Scott Andrews, Durham, NC (US); Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 714 days.

This patent is subject to a terminal disclaimer.

(21) Appl. No.: 11/895,795

(22) Filed: Aug. 27, 2007

(65) Prior Publication Data
US 2008/0054286 A1    Mar. 6, 2008

Related U.S. Application Data

(63) Continuation-in-part of application No. 11/044,779, filed on Jan. 27, 2005, now Pat. No. 7,326,583.

(51) Int. Cl.
| | |
|---|---|
| H01L 29/267 | (2006.01) |
| H01L 21/00 | (2006.01) |
| F21V 9/16 | (2006.01) |
| H01J 5/48 | (2006.01) |

(52) U.S. Cl. ............... 257/98; 257/81; 257/82; 257/91; 257/99; 257/E33.056; 257/E33.058; 257/E33.059; 438/27; 438/29; 362/84; 362/27; 313/318.11

(58) Field of Classification Search ............ 257/98, 257/81, 82, 91, 99, 436; 438/26, 27; 362/84, 362/267; 313/318.11

See application file for complete search history.

(56) References Cited

U.S. PATENT DOCUMENTS

| | | |
|---|---|---|
| 3,875,456 A | 4/1975 | Kano et al. |
| 4,918,497 A | 4/1990 | Edmond |
| 4,966,862 A | 10/1990 | Edmond |
| 5,027,168 A | 6/1991 | Edmond |
| 5,043,716 A | 8/1991 | Latz et al. |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |

(Continued)

FOREIGN PATENT DOCUMENTS
DE    10109349    9/2002

(Continued)

OTHER PUBLICATIONS

International Search Report and Written Opinion for PCT/US2005/009778 dated March 8, 2006.

(Continued)

*Primary Examiner* — David A Zarneke
(74) *Attorney, Agent, or Firm* — Jenkins, Wilson, Taylor & Hunt, P.A.

(57) ABSTRACT

Light emitting device packages, light emitting diode (LED) packages and related methods are disclosed. According to one aspect, a light emitting device package is provided. The package includes a mounting pad adapted for attachment of a light emitting device. A lens coupler is attached to the mounting pad and defines an opening for containing the light emitting device and a quantity of encapsulant. The lens coupler includes a surface defining a depression which comprises at least one edge that shapes an outer surface of the encapsulant.

25 Claims, 16 Drawing Sheets

U.S. PATENT DOCUMENTS

| | | | |
|---|---|---|---|
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 5,959,316 | A | 9/1999 | Lowery |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,274,890 | B1 | 8/2001 | Oshio et al. |
| 6,610,563 | B1 | 8/2003 | Waitl et al. |
| 6,635,363 | B1 | 10/2003 | Duclos et al. |
| 6,642,652 | B2 | 11/2003 | Collins, III et al. |
| 6,744,077 | B2 | 6/2004 | Trottier et al. |
| 6,747,406 | B1 | 6/2004 | Bortscheller et al. |
| 6,765,801 | B1 | 7/2004 | Glenn et al. |
| 6,897,490 | B2 | 5/2005 | Brunner et al. |
| 6,946,714 | B2 | 9/2005 | Waitl et al. |
| 6,953,952 | B2 | 10/2005 | Asakawa |
| 7,078,254 | B2 | 7/2006 | Loh |
| 7,210,807 | B2 * | 5/2007 | Sakamoto et al. ............. 362/84 |
| 7,326,583 | B2 | 2/2008 | Andrews |
| 2001/0030326 | A1 | 10/2001 | Reeh et al. |
| 2002/0057056 | A1 | 5/2002 | Okazaki |
| 2002/0079837 | A1 | 6/2002 | Okazaki |
| 2002/0123164 | A1 | 9/2002 | Slater, Jr. et al. |
| 2002/0163001 | A1 | 11/2002 | Shaddock |
| 2003/0006418 | A1 | 1/2003 | Emerson et al. |
| 2003/0141510 | A1 | 7/2003 | Brunner et al. |
| 2003/0211804 | A1 | 11/2003 | Sorg |
| 2004/0041222 | A1 | 3/2004 | Loh |
| 2004/0056260 | A1 | 3/2004 | Slater, Jr. et al. |
| 2004/0126913 | A1 | 7/2004 | Loh |
| 2005/0221518 | A1 | 10/2005 | Andrews |
| 2006/0186423 | A1 | 8/2006 | Blonder et al. |
| 2006/0278882 | A1 | 12/2006 | Leung et al. |

FOREIGN PATENT DOCUMENTS

| | | |
|---|---|---|
| EP | 1187226 | 9/2000 |
| JP | 08032120 | 2/1996 |
| JP | 09027643 | 1/1997 |
| JP | 10065220 | 3/1998 |
| JP | 10190065 | 7/1998 |
| JP | 2000-252523 | 2/1999 |
| JP | 3604298 | 12/2004 |
| JP | 2005-197369 | 7/2005 |
| WO | WO 01/015242 | 3/2001 |
| WO | WO 2004/068594 | 3/2001 |
| WO | WO 2005/ 098975 | 10/2005 |
| WO | WO 2005/ 098976 | 10/2005 |
| WO | WO 2005/ 098977 | 10/2005 |

OTHER PUBLICATIONS

International Search Report and Written Opinion for PCT/US2005/009779 dated Feb. 28, 2006.

International Search Report and Written Opinion for PCT/US2005/010034 dated Feb. 22, 2006.

* cited by examiner

LIGHT EMITTING DEVICE PACKAGES, LIGHT EMITTING DIODE (LED) PACKAGES AND RELATED METHODS

RELATED APPLICATIONS

This application is a continuation-in-part application of U.S. patent application Ser. No. 11/044,779, titled "Reflector Packages and Methods for Packaging of a Semiconductor Light Emitting Device" and filed Jan. 27, 2005 now U.S. Pat. No. 7,326,583; the disclosure of which is incorporated herein by reference in its entirety.

TECHNICAL FIELD

The subject matter described herein relates to semiconductor device packages. More particularly, the subject matter described herein relates to light emitting device packages, light emitting diode packages and related methods.

BACKGROUND

Semiconductor light emitting devices, such as a light emitting diode (LED), may be provided in a package for protection, color selection, focusing, and the like for light emitted by the device. An LED package generally includes a substrate member on which an LED is mounted. The LED may include a mounting pad attached to the substrate member with electrical connections being made to the LED for applying an electrical bias. LEDs generally comprise an active region of semiconductor material sandwiched between two oppositely doped layers. When a bias is applied across the doped layers, holes and electrons are injected into the active region where they recombine to generate light. Light is emitted omnidirectionally from the active layer and from all surfaces of the LED. The substrate member may also include traces or metal leads for connecting the package to external circuitry and the substrate may also act as a heat sink to conduct heat away from the LED during operation.

An LED package may include a lens positioned for receiving light emitted by an LED in the package. The lens may include optical materials intended to influence or change the nature of the light emitted by the LED. Further, the lens may be suitably shaped for scattering the light and/or otherwise redirecting or influencing the light.

A lens is typically attached to the LED package by use of encapsulant. For example, an LED may be positioned within an opening formed by the LED package. The opening may be filled with encapsulant, and the lens attached to the top of the encapsulant at an open end of the opening. Light generated by the LED may pass through the encapsulant for receipt by the LED.

LED packages are intended to operate in a wide range of environments. Typically, LED packages are expected to operate over a wide range of varying temperatures. One difficulty in current LED packages is that voids form in encapsulant used to attach a lens when operated in varying temperatures. The formation of voids can cause substantial degradation in the quality of light emitted by the LED package. In particular, the void can cause the light passing through the encapsulant to appear non-uniform when emitted from the package. It is desirable to provide improvements in LED packages and techniques used for attaching a lens to an LED package. Particularly, it would be beneficial to provide techniques for minimizing or preventing the formation of voids in encapsulant.

Accordingly, there exists a need for light emitting device packages, LED packages and related methods that provide improvements in the quality of emitted light.

SUMMARY

According to one aspect, the subject matter described herein includes light emitting device packages, light emitting diode packages and related methods. According to one aspect, a light emitting device packages includes a mounting pad adapted for attachment of a light emitting device. The package also includes a lens coupler attached to the mounting pad. The lens coupler defines an opening for containing the light emitting device and a quantity of encapsulant. Further, the lens coupler includes a surface defining a depression which comprises at least one edge that shapes an outer surface of the encapsulant.

According to another aspect, a method of forming a light emitting device package includes providing a mounting pad adapted for attachment of a light emitting device. Further, a lens coupler is attached to the mounting pad. The lens coupler defines an opening for containing the light emitting device. Further, the lens coupler includes a surface defining a depression which comprises at least one edge. An encapsulant is deposited in the opening such that the at least one edge of the surface shapes an outer surface of the encapsulant. Further, a lens is positioned to substantially enclose the opening and to interface with the convex meniscus of the encapsulant.

According to another aspect, an LED package includes a substrate including a mounting pad. An LED is attached to the mounting pad. Further, a lens coupler is attached to the mounting pad. The lens coupler defines an opening for containing the LED and a first quantity of encapsulant. The lens coupler includes at least one surface defining a first depression which comprises a first edge that shapes the first quantity of encapsulant. Further, the surface defines second depression which comprises a second edge that substantially surrounds the first edge and shapes an outer surface of a second quantity of encapsulant. A lens is positioned to substantially enclose the opening and to interface with the first and second encapsulants.

According to yet another aspect, a method of forming an LED package includes providing a substrate including a mounting pad. Further, the method includes attaching an LED to the mounting pad. A lens coupler is attached to the mounting pad. The lens coupler defines an opening for containing the LED. Further, the lens coupler includes at least one surface defining a first depression which comprises a first edge. The surface also defines a second depression which comprises a second edge that substantially surrounds the first edge. A first quantity of encapsulant is deposited in the opening such that the first edge of the surface shapes an outer surface of the first quantity of encapsulant. Further, a second quantity of encapsulant is deposited on the first quantity of encapsulant such that the second edge of the surface shapes an outer surface of the second quantity of encapsulant. A lens is positioned to substantially enclose the opening and to interface with the second quantity of encapsulant.

BRIEF DESCRIPTION OF THE DRAWINGS

Preferred embodiments of the subject matter described herein will now be explained with reference to the accompanying drawings of which.

DETAILED DESCRIPTION

Figure 1:
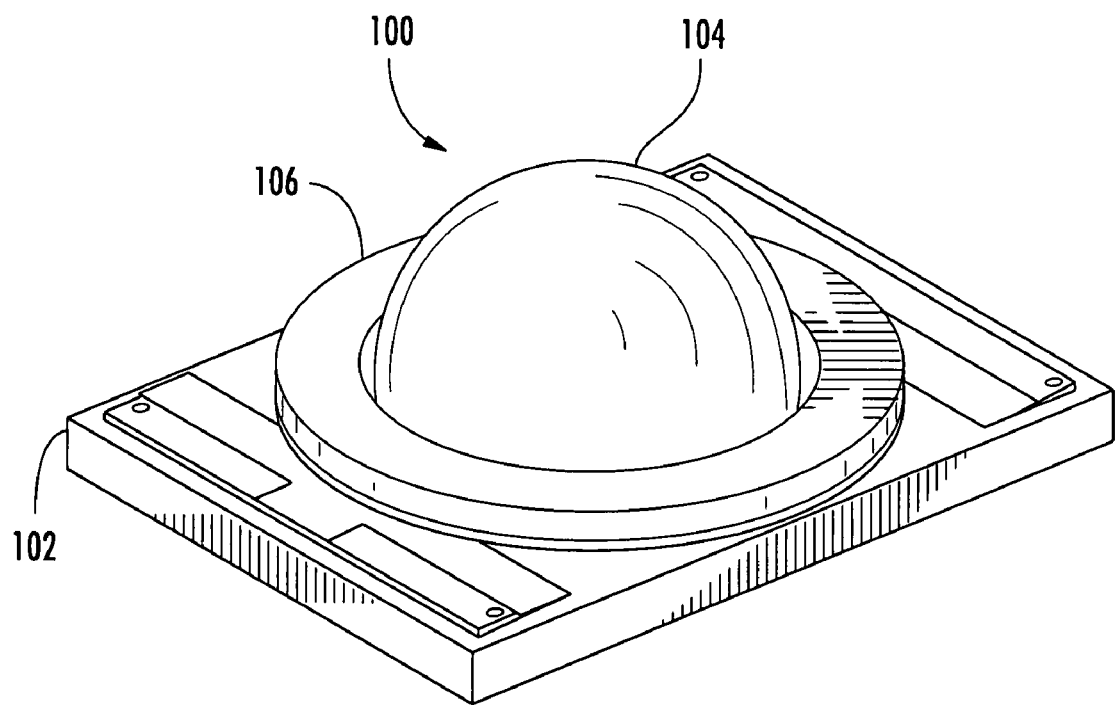
FIG. 1 is a top perspective view of a light emitting device package according to an embodiment of the subject matter described herein.

Light emitting device packages, LED packages and related methods are described herein with reference to FIGS. 1-8G, which illustrate various embodiments. As illustrated in the Figures, some sizes of structures or portions may be exaggerated relative to other structures or portions for illustrative purposes and, thus, are provided to illustrate the general structures of the subject matter disclosed herein. Further, various aspects of the subject matter disclosed herein are described with reference to a structure or a portion being formed on other structures, portions, or both. As will be appreciated by those of skill in the art, references to a structure being formed "on" or "above" another structure or portions contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

According to one aspect of the subject matter disclosed herein, a light emitting device package is provided. The package includes a mounting pad adapted for attachment of a light emitting device. A lens coupler is attached to the mounting pad and defines an opening for containing the light emitting device and a quantity of at least partially cured encapsulant. The lens coupler includes a surface defining a depression which comprises at least one edge that substantially surrounds an open end of the opening and that shapes the encapsulant into a convex meniscus. The package may include a lens positioned to substantially enclose the opening and to interface with the convex meniscus of the encapsulant.

Further, in accordance with another aspect of the subject matter disclosed herein, an LED package is provided. The package includes a substrate including a mounting pad. An LED may be attached to the mounting pad. A lens coupler may be attached to the mounting pad and define an opening for containing the LED and a first quantity of encapsulant. The lens coupler includes at least one surface defining a first depression which comprises a first edge that substantially surrounds an open end of the opening and that shapes the first quantity of encapsulant into a first convex meniscus. The surface defines a second depression which comprises a second edge that substantially surrounds the first edge and shapes a second quantity of encapsulant into a second convex meniscus. Further, a lens may be positioned to substantially enclose the opening and to interface with the convex meniscus of the encapsulant.

As used herein, the term "light emitting device" may include an LED, laser diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. The design and fabrication of semiconductor light emitting devices is well known to those having skill in the art and need not be described in detail herein. For example, the semiconductor light emitting device may be gallium nitride-based LEDs or lasers fabricated on a silicon carbide substrate such as those devices manufactured and sold by Cree, Inc. of Durham, N.C., although other emitting devices from other material systems may also be used.

As used herein, the term "encapsulant" may include any suitable transparent or semitransparent material for adhering objects together. For example, an encapsulant can be a liquid silicone gel or epoxy-based material. Further, the encapsulant may contain one or more of oxide particles, silicates, nanoparticles, light scattering particles, light diffusing particles, color filtering material, and phosphors of the same or different type.

Figure 2:
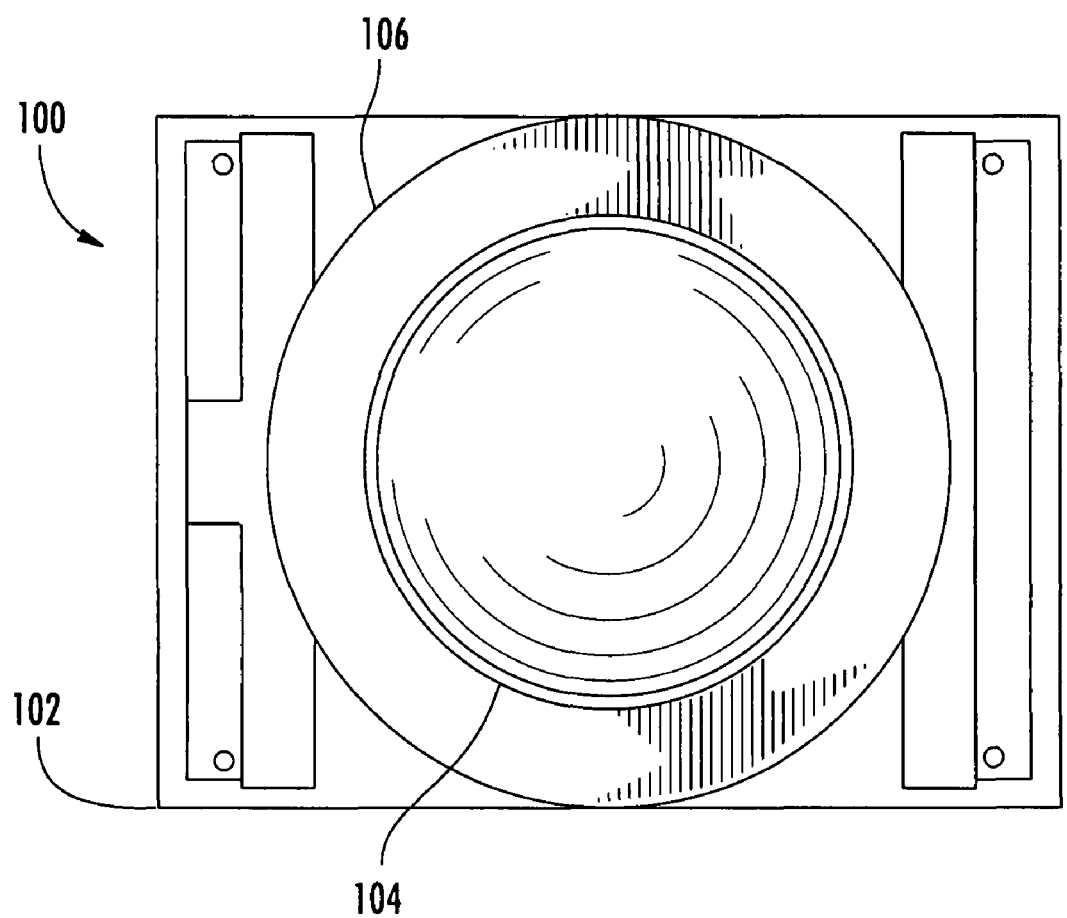
FIG. 2 is a top plan view of the light emitting device package shown in FIG. 1.
Figure 3:
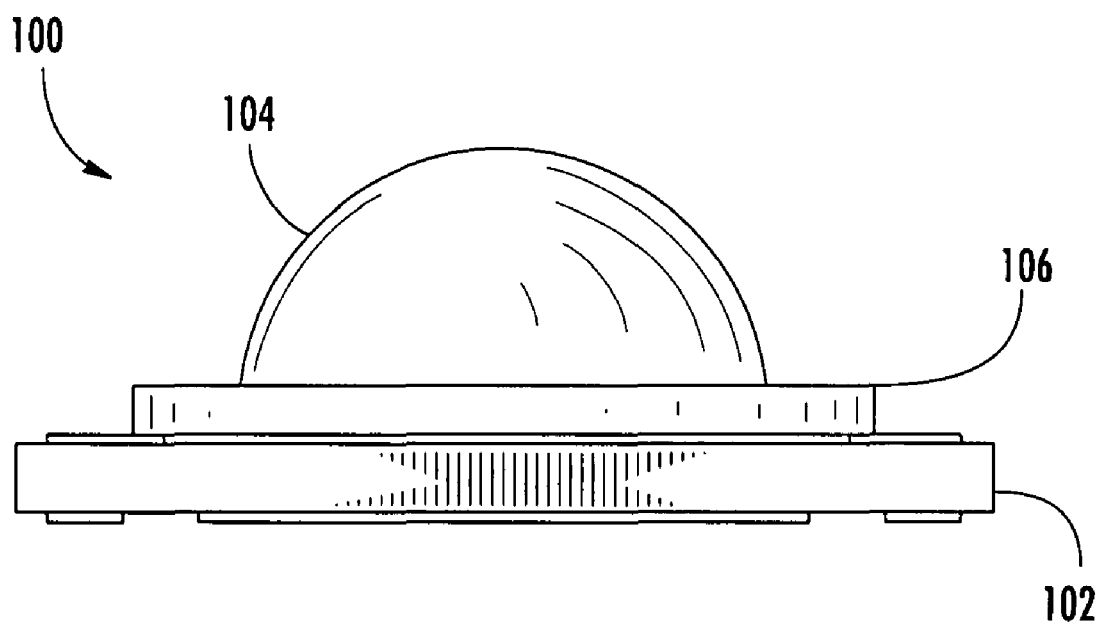
FIG. 3 is a side plan view of the light emitting device package shown in FIGS. 2 and 3.

FIGS. 1, 2 and 3 are a top perspective view, a top plan view, and a side plan view, respectively, of a light emitting device package, generally designated 100, according to an embodiment of the subject matter described herein. Referring to FIGS. 1-3, package 100 includes a substrate 102, a lens 104, and a lens coupler 106. Lens coupler 106 can be adapted for attachment to substrate 102 and for placement of lens 104 in an operable position with respect to a light emitting device, which is attached to substrate 102. The operable position can include positions at which light emitted by a light emitting device attached to substrate 102 can transmit through lens 104. Particularly, lens coupler 106 can be structured, as described in more detail hereinbelow, to align a center of lens 104 along a vertical axis with the light emitting device.

Lens 104 may be made from material having high light transmissivity such as, for example only, glass, quartz, high temperature and transparent plastic, or a combination of these materials. The lens may define a recess in the bottom thereof having a curved, hemispherical, or other geometry, which can be filled with optical materials intended to influence or change the nature of the light emitted by a light emitting device in package 100. Examples of one type of optical material are luminescence converting phosphors, dyes, fluorescent polymers or other materials which absorb some of the light emitted by the light emitting device and re-emit light of different wavelengths. Examples of another type of optical material are light diffusants such as calcium carbonate, scattering particles (such as titanium oxides) or voids which disperse or scatter light. Any single or combination of the above materials can be applied on the lens to obtain certain spectral luminous performance.

Substrate 102 may be formed of many different materials, including electrically insulating materials. Suitable substrate materials include, but are not limited to, ceramic materials such as aluminum nitride (AlN) and alumina ($Al_2O_3$). Dimensions of substrate 102 can vary widely depending on application and processes used to manufacture package 100. For example, in the illustrated embodiment, substrate 102 may have dimensions ranging from fractions of millimeters (mm) to tens of millimeters.

Lens coupler 106 may be disk-shaped or any other suitable shape and formed of a durable, high melting temperature material that can withstand subsequent packaging manufacturing steps and the heat generated by the package during operation. Many different materials can be used, including plastics, such as a Novella resin, or liquid crystal polymers. Lens coupler 106 may be made of a material that reflects and/or scatters light.

Figure 4A:
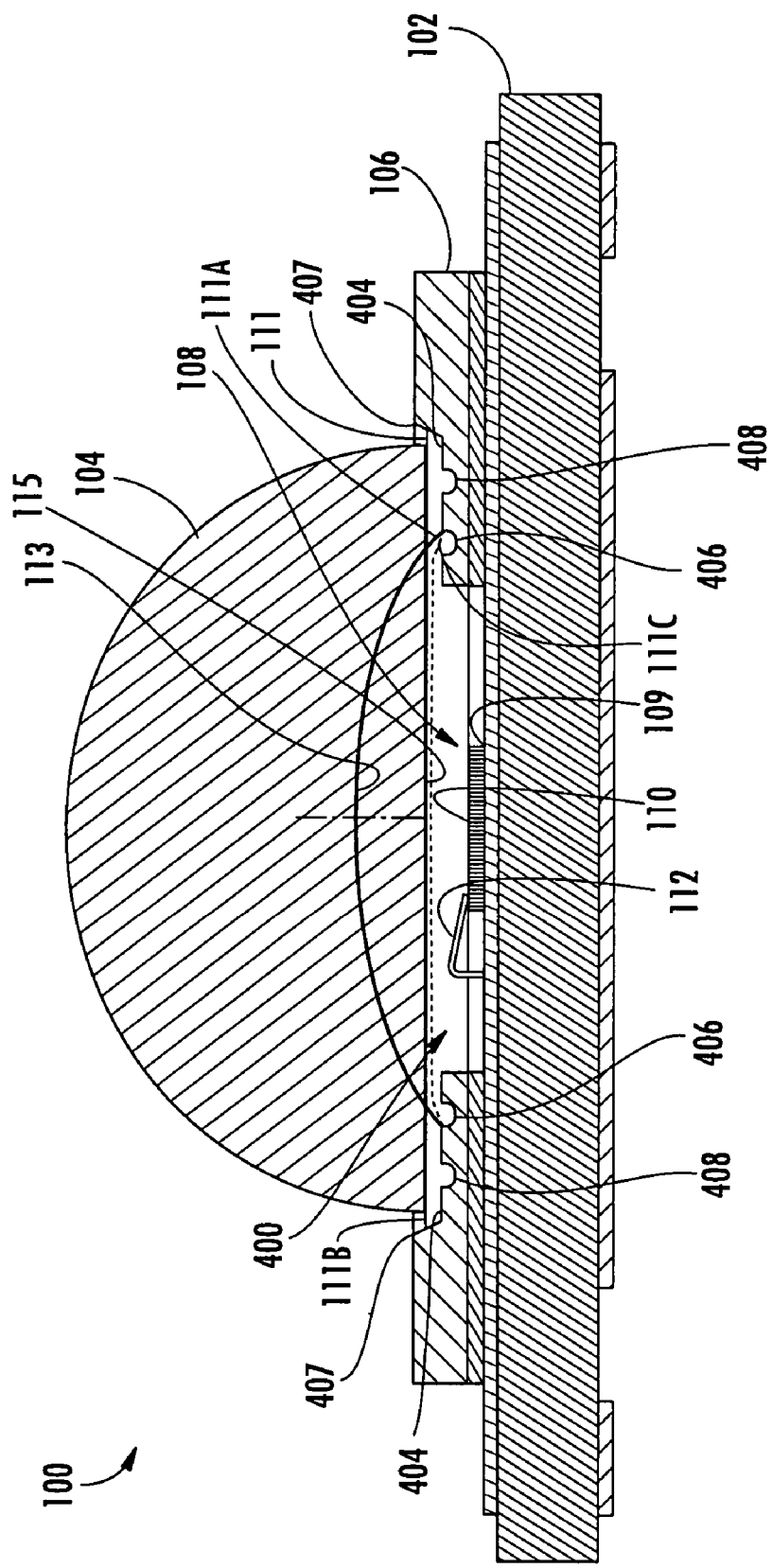
FIG. 4A is a cross-sectional side view of the light emitting device package shown in FIGS. 1-3.

FIG. 4A is a cross-sectional side view of package 100 shown in FIGS. 1-3. Referring to FIG. 4A, a semiconductor light emitting device assembly, generally designated 108, is mounted on a mounting pad 109 attached to the top of substrate 102. Assembly 108 can include an LED 110, which may be mounted to a mounting pad 109. Mounting pad 109 may be mounted to substrate 102 with electrical connections being made to LED 110 for applying an electrical bias. A top surface of LED 110 may be connected to electrical connections via one or more conductive bond wires 112.

Lens coupler 106 can include reflective surfaces positioned to reflect light generated by LED 110. Particularly, the reflective surfaces can be positioned for directing the light upwardly and away from package 100 so that it can contribute to useful light emission of package 100. Further, lens coupler 106 can have many different shapes and sizes and to enhance its reflectivity, may include a reflective element covering different portions of the coupler surface around LED 110. Alternatively, lens coupler 106 can be made of a reflective material such that light from LED 110 directed toward the surfaces of coupler 106 is reflected to contribute to package emission.

Lens 104 may be attached to substrate 102 and lens coupler 106 by use of an encapsulant 111. In particular, encapsulant 111 may be deposited in a space 400 defined between substrate 102, lens 104, and/or lens coupler 106. Encapsulant 111 may be any suitable type of resin material such as a silicone or epoxy-based material. The volume of encapsulant 111 may be kept at a minimum such that assembly 108 is positioned within space 400 and such that lens 104 is securely attached to substrate 102. Further, the distance of the spacing between substrate 102 and lens 104 may be kept at a minimum such that the vertical movement of lens 104 is at a minimum over the operating temperature ranges of package 100. In one example, if the distance between substrate 102 and lens 104 is about 100 μm, lens 104 only moves up by a few microns at a high operating temperature. Further, the distance between substrate 102 and lens 104 can be less than about 100 μm.

Lens 104 can be placed on top of and adhere to encapsulant 111. Lens 104 is not rigidly bonded to lens coupler 106. This "floating lens" design will ensure that encapsulant 111 can expand and contract under high and low temperature conditions without problem. For instance, when package 100 is operating or being subjected to a high temperature environment, encapsulant 111 experiences greater volumetric expansion than the cavity space that contains it. By allowing lens 104 to float somewhat freely on top of encapsulant 104, no encapsulant will be squeezed out of its cavity space. Likewise, when package is subjected to cold temperature, encapsulant 111 will contract more than the other components that make up the cavity space for encapsulant 111. Lens 104 will float freely on top of encapsulant 111 as the latter shrinks and its level drops. Hence, the reliability of package 100 is maintained over a relatively large temperature range as the thermal stresses induced on its encapsulant 111 is reduced by the floating lens design.

Figure 4B:
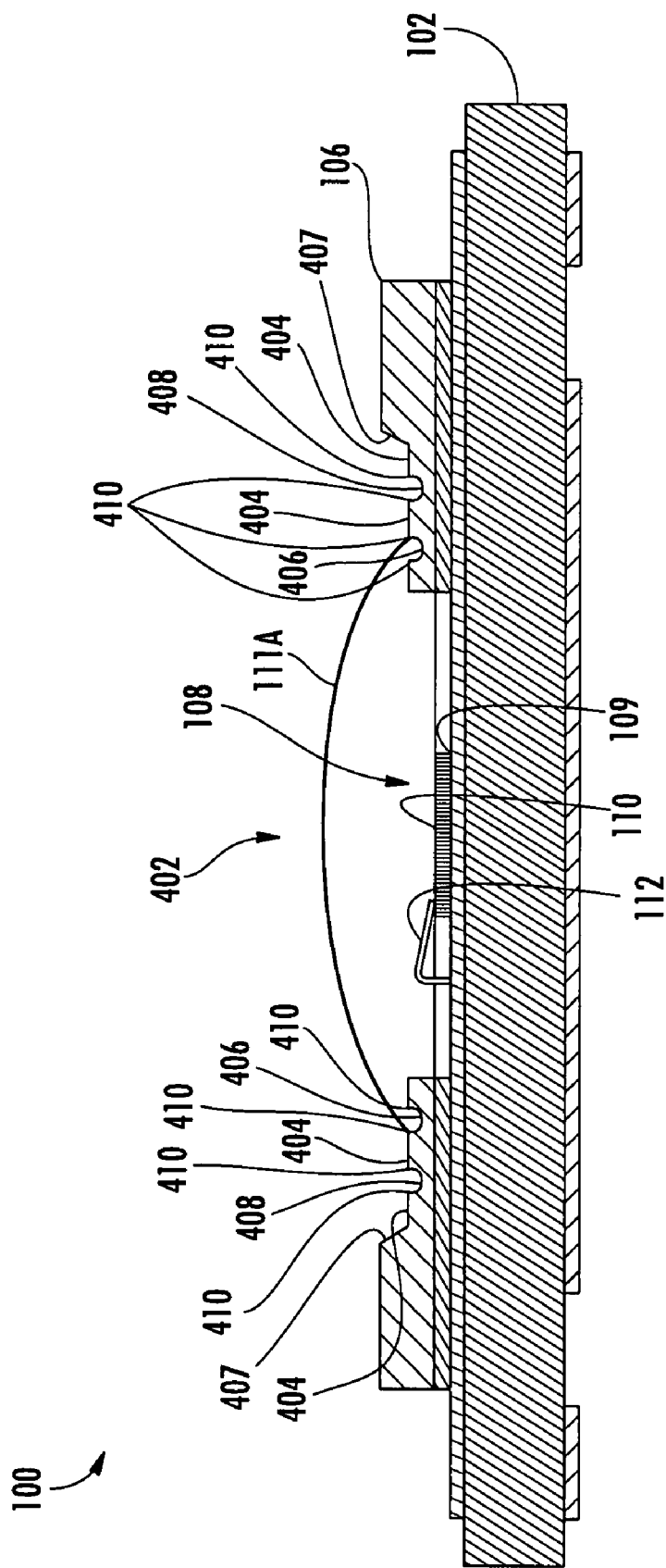
FIG. 4B is a cross-sectional side view of an assembly step of the light emitting device package shown in FIG. 4A.

During assembly of package 100, lens coupler 106 is bonded to substrate 102. Subsequently, lens 104 is attached to lens coupler 106 and substrate 102 by use of encapsulant 111. Initially, a first quantity of encapsulant is deposited within an opening defined by the attachment of lens coupler 106 to mounting pad 109. FIG. 4B is a cross-sectional side view of package 100 at an assembly step when a first quantity of encapsulant 111A is deposited within an opening, generally designated 402, defined by the attachment of lens coupler 106 to mounting pad 109. Referring to FIG. 4B, encapsulant 111A is deposited in an opening 402. Opening 402 can include an open end into which encapsulant 111A is deposited. The open end of opening 402 is defined by ledge surface 404 of lens coupler 106, which surrounds the open end of opening 402.

Lens coupler 106 includes a ledge surface 404 that substantially surrounds the open end of opening 402. Ledge surface 404 defines first and second depressions 406 and 408, which substantially surround the open end. Depressions 406 and 408 include edges 410 formed at an interface of surface 404 and the depressions. Opening 402 is filled with encapsulant 111A until the encapsulant 111A forms a convex meniscus, which is formed by an edge of depression 406. Depression 406 can entirely or at least substantially surround the open end of opening 402 (see also FIGS. 5 and 6). Further, edges 410 of depression 406 can entirely or at least substantially surround the open end of opening 402. Subsequent to forming the convex meniscus, encapsulant 111A can be partially or fully cured. For example, the encapsulant may be cured to about 50%.

Depressions 406 and 408 can have any suitable size and shape for forming an outer surface of encapsulant 111A. For example, the depression can have substantially vertical walls such that a convex meniscus is formed by encapsulant 111A when opening 402 is filled with encapsulant 111A. In one example, a vertical wall of depressions 406 and 408 can be about 90° with respect to ledge surface 404. Further, a wall of depressions 406 and 408 can be inclined in the range of between about 60° and about 90° with respect to ledge surface 404. The width and depth of depressions 406 and 408 can range between 5 and 10 mils, although the depressions may have any other suitable depth or width.

Figure 4C:
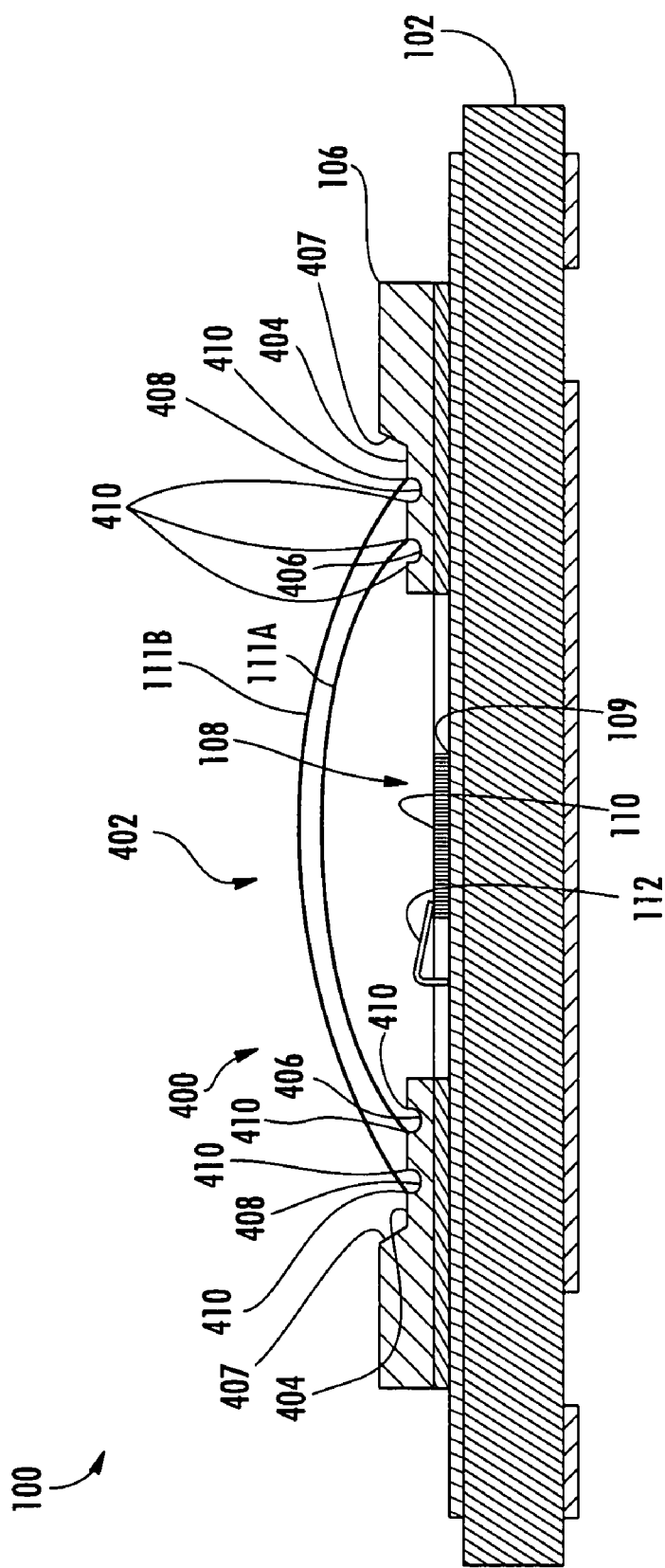
FIG. 4C is a cross-sectional side view of another assembly step of the light emitting device package shown in FIG. 4A.

FIG. 4C is a cross-sectional side view of package 100 at an assembly step when a second quantity of encapsulant 111B is deposited within opening 402. Referring to FIG. 4C, encapsulant 111B can be deposited directly on encapsulant 111A. In particular, encapsulant 111B can cover encapsulant 111B and form a convex meniscus. The convex meniscus of encapsulant 111B can be formed by one of the edges of depression 408. Depression 408 can entirely or at least substantially surround the open end of opening 402 (see also FIGS. 5 and 6). Further, edges 410 of depression 408 can entirely or at least substantially surround the open end of opening 402. Encapsulant 111B may be uncured or partially cured. Encapsulant 111B can be deposited in an amount such that the encapsulant does not overflow guide surfaces 407 of opening 402 when a lens is positioned on top of the encapsulant. Surfaces 404 and 407 may be reflective for reflecting light generated by LED 110 in a substantially upward direction. Alternatively, surfaces 404 and 407 may be non-reflective.

Together, encapsulant 111A and 111B can form encapsulant 111 shown in FIG. 4A. Encapsulant 111A is substantially or entirely cured such that it remains in a form with a convex meniscus even after placement of lens 104. Lens 104 includes a concave surface 113 in the bottom thereof that substantially conforms to a surface of the convex meniscus of encapsulant 111A. Encapsulant 111B is left uncured or only partially cured such that lens 104 "rests" or "floats" on encapsulant 111B after placement. As shown in FIG. 4A, encapsulant 111B spreads laterally and over ledge surface 404 after placement of lens 104.

In an alternative embodiment, lens 104 may include a flat surface 115 (shown to be coplanar with the top surface of encapsulant 111B) that is positioned to face the encapsulant and LED 110. Lens 104 is substantially hemispherical in shape, and the flat surface of lens 104 is facing the encapsulant and LED 110. Further, in this embodiment, at least a portion of the top surface of encapsulant 111A may substantially conform to flat surface 115. As a result, the top surface of encapsulant 111A is lower than the position indicated by reference numeral 111A and at the position indicated by reference numeral 111C.

The forming separate forming of encapsulant portions 111A and 111B as described herein serves to minimize or prevent the formation of voids within encapsulant 111. Particularly, the formation of voids is minimized or prevented by placement of lens 104 onto encapsulant portions 111A and 111B. A bottom surface of lens 104 is positioned to interface with the top surface of encapsulant 111A. As lens 104 is positioned onto encapsulant 111A, encapsulant 111B is forced from between lens 104 and encapsulant 111A to rest on top of ledge surface 404 along the outer edge of encapsulant 111A. The outside edge of lens 104 interfaces with encapsulant 111B. Because encapsulant 111B is forced from between lens 104 and encapsulant 111A, bubble formation is minimized or prevented in the areas where light passes through encapsulant 111. As a result of reduced bubbles in these areas, the quality of light produced by light emitting device package 100 is improved.

Lens coupler 106 may be adapted to precisely align lens 104 with LED 110 during assembly. Lens coupler 106 may include one or more top surfaces that are shaped to substantially fit to a bottom portion of lens 104 and function as a guide for aligning lens 104 into its operational position with respect to LED 110. Particularly, ledge surface 404 may substantially fit to an outside edge of a bottom surface of lens 104. When lens 104 is fitted to lens coupler 106 in this way, LED 110 is substantially aligned with lens 104. Further, lens coupler 106 may include one or more guide surfaces 407 adapted for guiding the movement of lens 104 into its operational position during assembly. Guide surface 407 can be substantially funnel shaped for precisely positioning the outside edge of bottom surface 404 against ledge surface 404.

Figure 5:
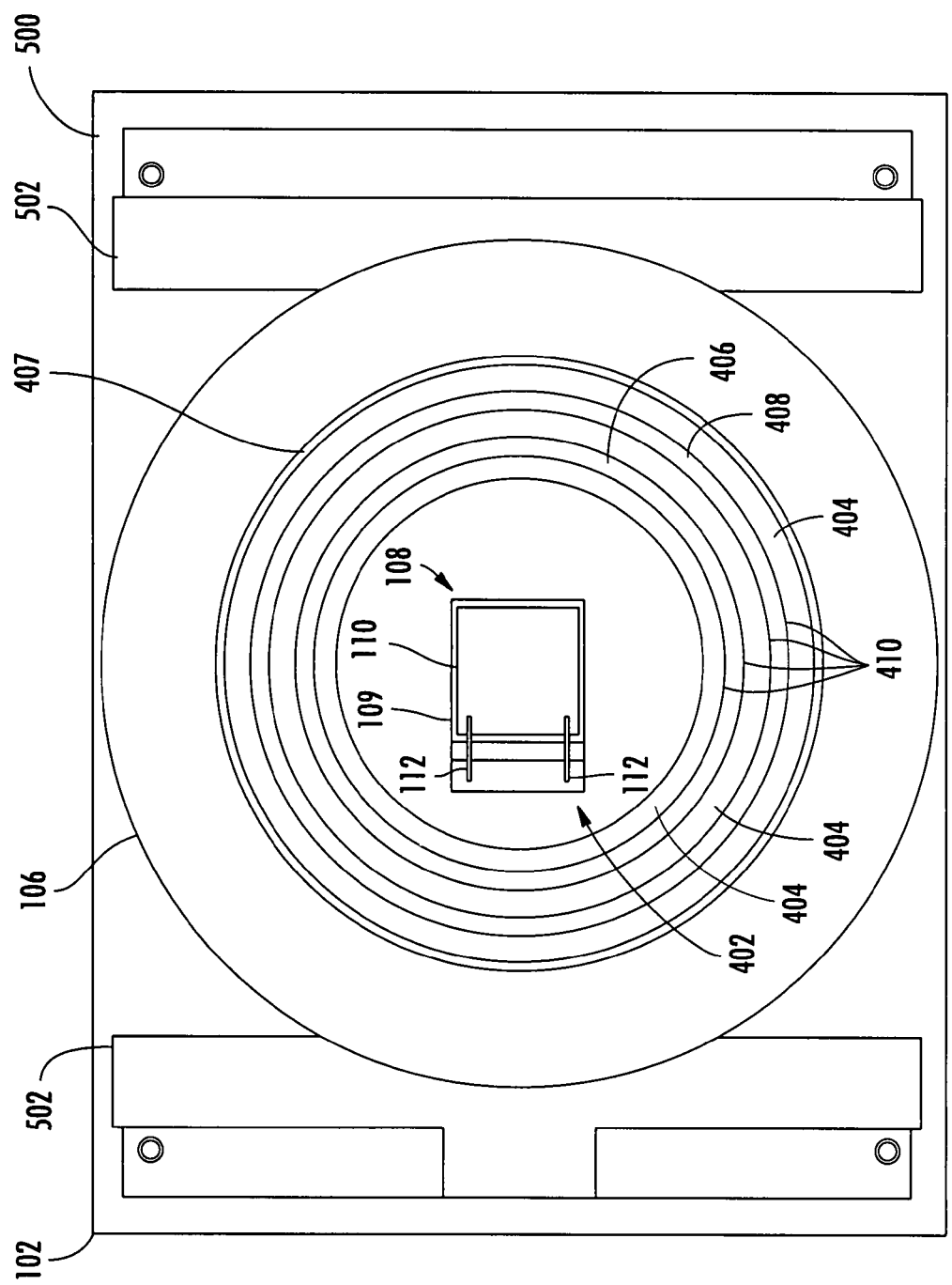
FIG. 5 is a top plan view of a substrate, a lens coupler, and a light emitting device assembly according to an embodiment of the subject matter described herein.

FIG. 5 is a top plan view of substrate 102, lens coupler 106, and light emitting device assembly 108. Referring to FIG. 5, substrate 102 includes a top surface 500 having electrical traces 502 and mounting pad 109. LED 110 can be mounted to mounting pad 109. Electrical traces 502 provide a conductive path for electrical connection of LED 110. Mounting pad 109 covers a portion of top surface 500 and a portion of electrical traces 502. Further, mounting pad 109 can be located near or at the center of top surface 500 or at any other suitable location on surface 500. Electrical traces 502 can provide electrical connection to LED 110 either through a submount or by bond wires 112.

Depressions 406 and 408 are each substantially shaped as circles that surround opening 402, which leads to assembly 108. Particularly, depressions 406 and 408 form circles having LED 110 positioned at a common center. Edges 410 of depressions 406 and 408 also substantially surround opening 402, which leads to assembly 108.

Figure 6:
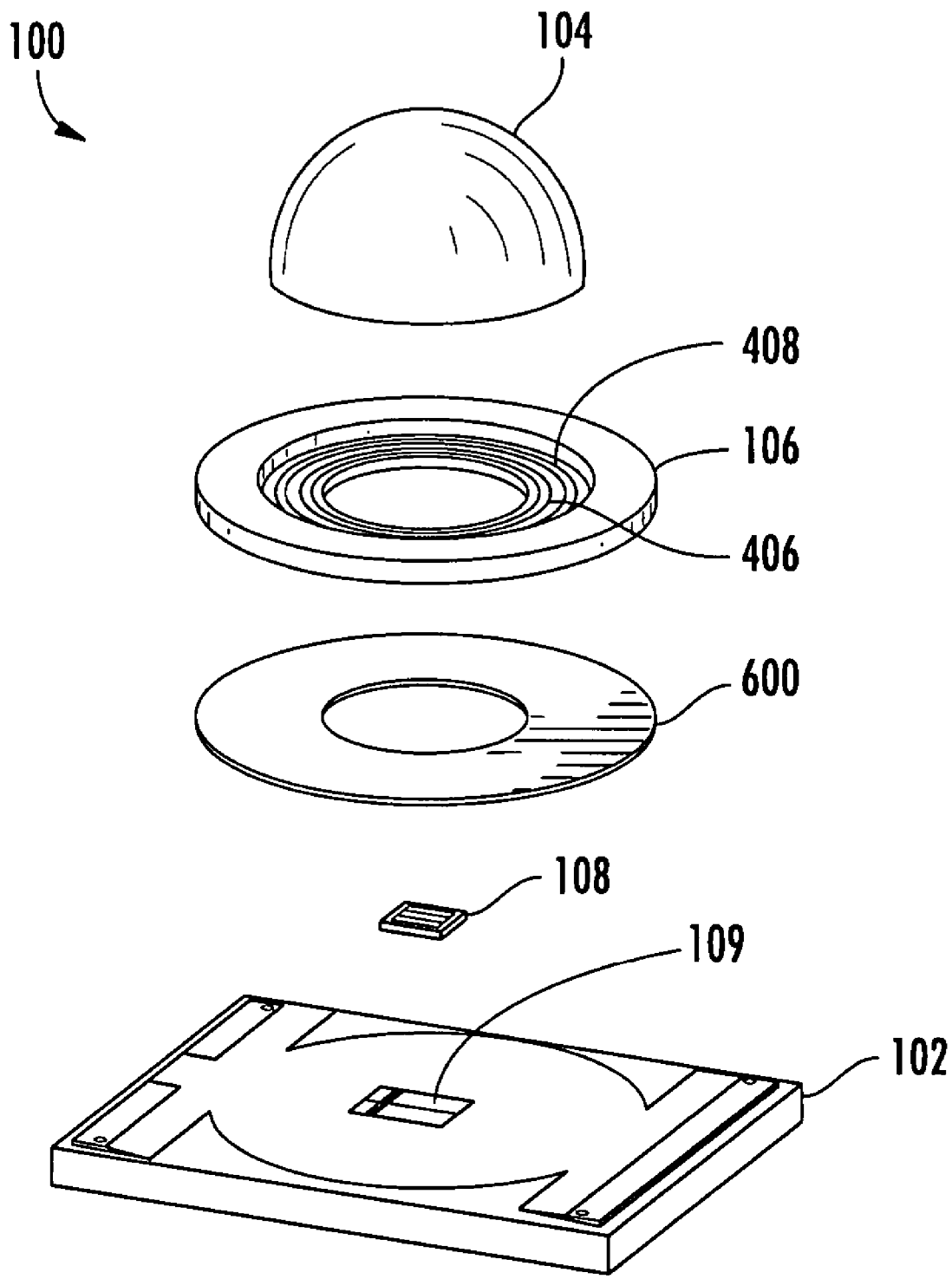
FIG. 6 is an exploded perspective view of a light emitting device package according to an embodiment of the subject matter described herein.

FIG. 6 is an exploded perspective view of light emitting device package 100. Referring to FIG. 6, a quantity of epoxy 600 can attach lens coupler 106 to substrate 102. Alternatively, any other suitable adhesive or attachment technique may be utilized for attaching lens coupler 106 to substrate 102.

Figure 7:
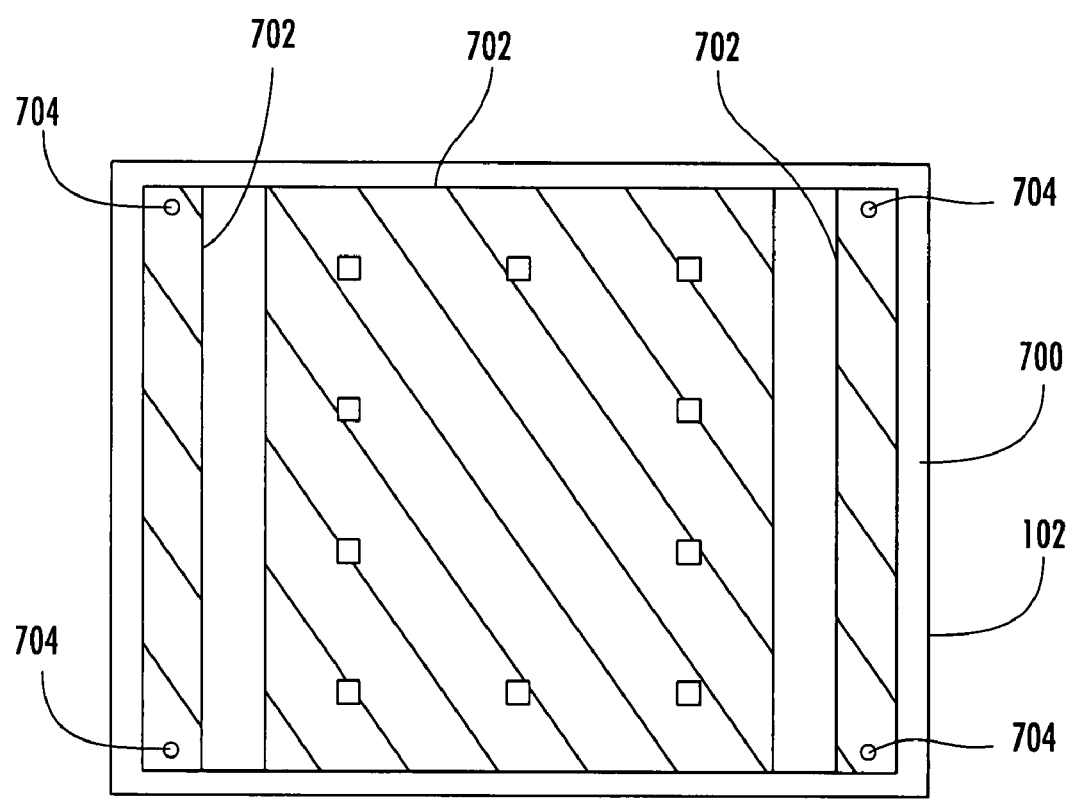
FIG. 7 is a bottom plan view of a substrate according to an embodiment of the subject matter described herein.

FIG. 7 is a bottom plan view of substrate 102. Referring to FIG. 7, conductive portions 702 can be attached to a bottom surface 702 of substrate 102. Conductive portions 702 may be made of any suitable metal. Further, conductive portions 702 may be connected to the electrical traces on the top surface of substrate 102 for providing electrical connection of LED 110 to an underside of substrate 102. Apertures or vias 704 may be formed through substrate 102 and include electrical traces having conductive paths for connecting the electrical traces on the top surface of substrate 102 to conductive portions 702.

Figure 8A:
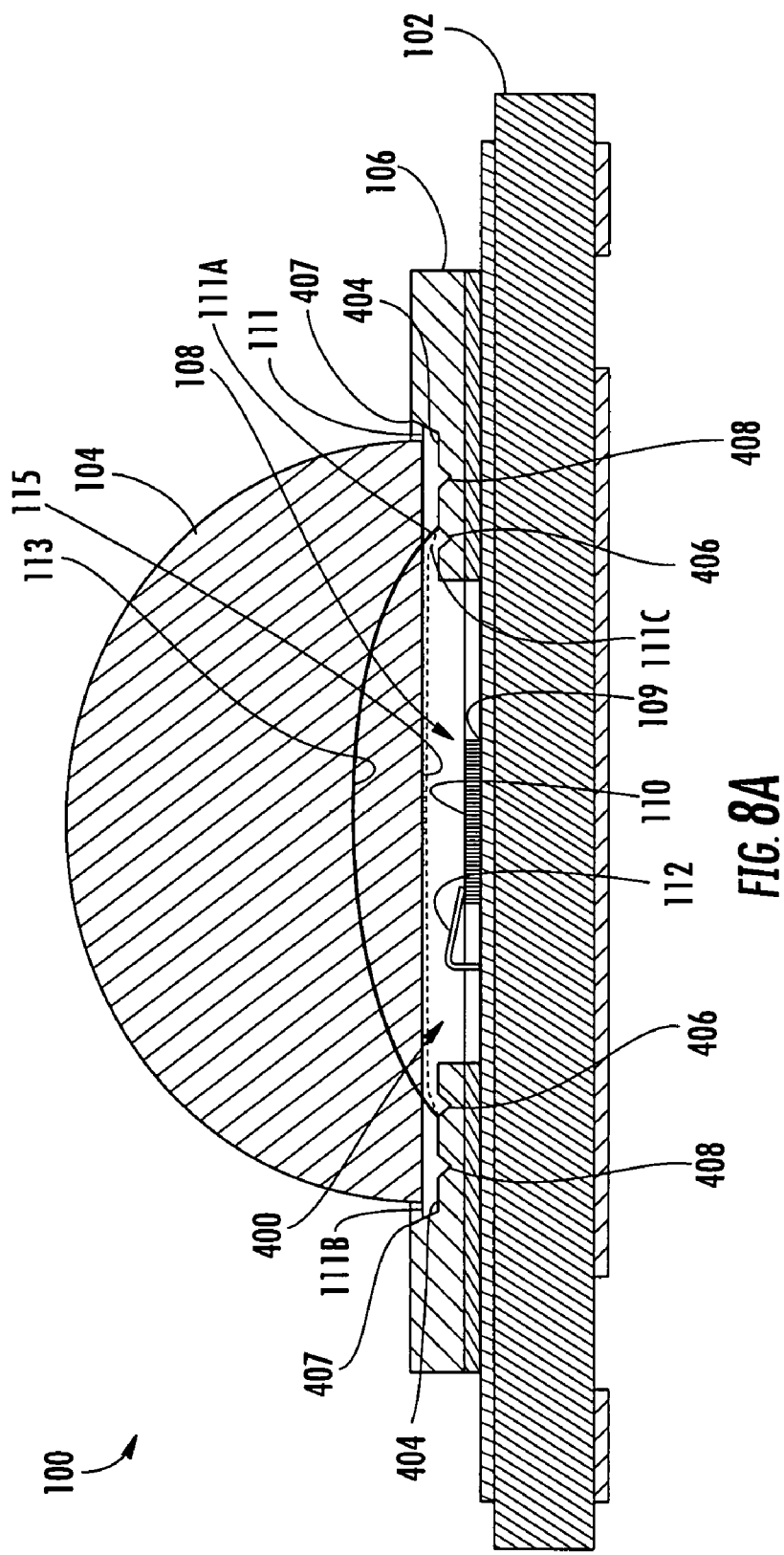
FIGS. 8A-8G are cross-sectional side view of a light emitting device package showing alternative embodiments of a lens coupler.
Figure 8B:
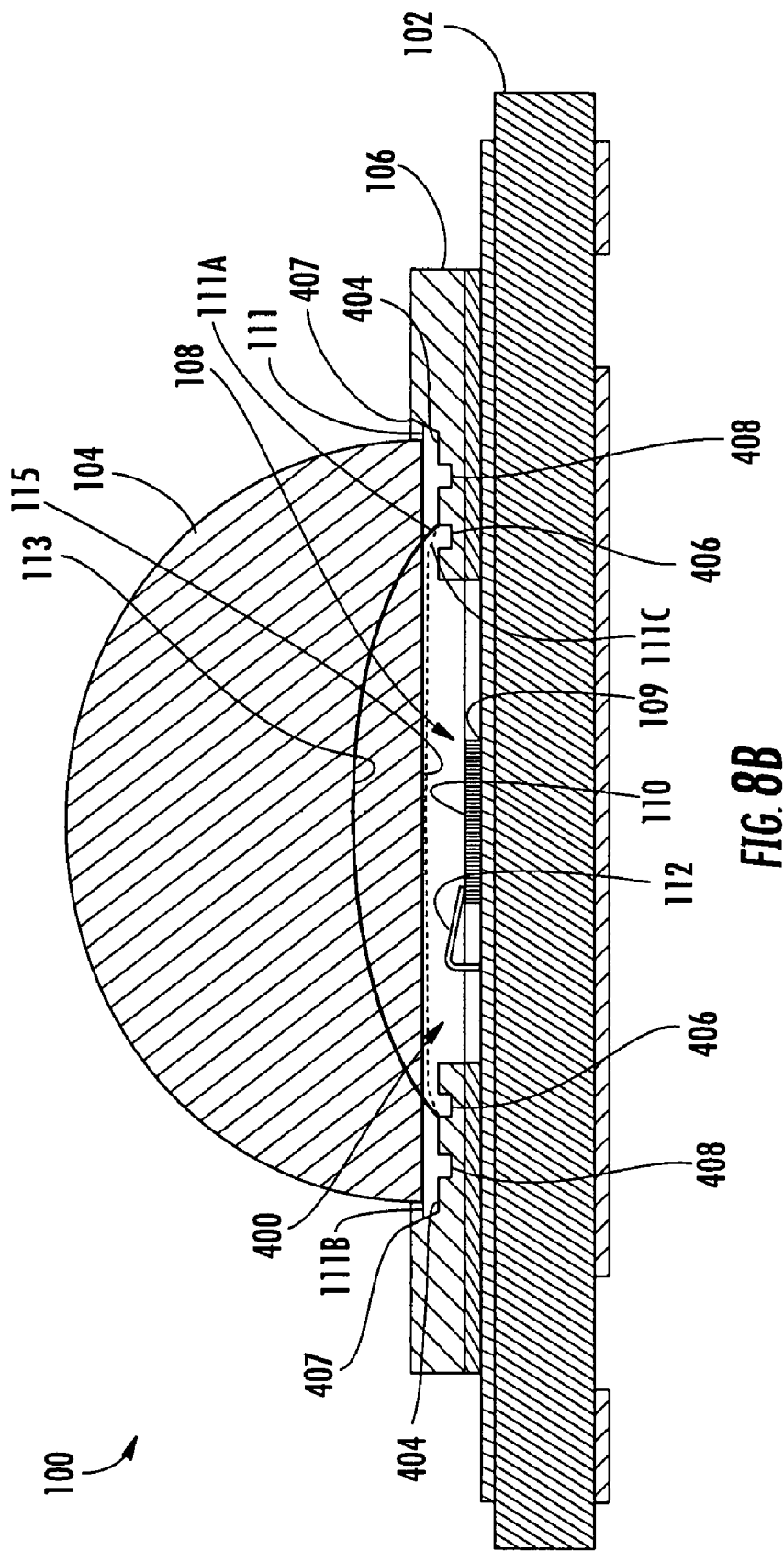

FIGS. 8A-8G illustrate alternative embodiments of lens coupler 106. In particular, referring to FIG. 8A, depressions 406 and 408 are triangular in shape. Referring to FIG. 8B, depressions 406 and 408 are square shaped. Depressions 406 and 408 may be any other suitable shape having at least one edge that shapes an outer surface of the encapsulant.

Figure 8C:
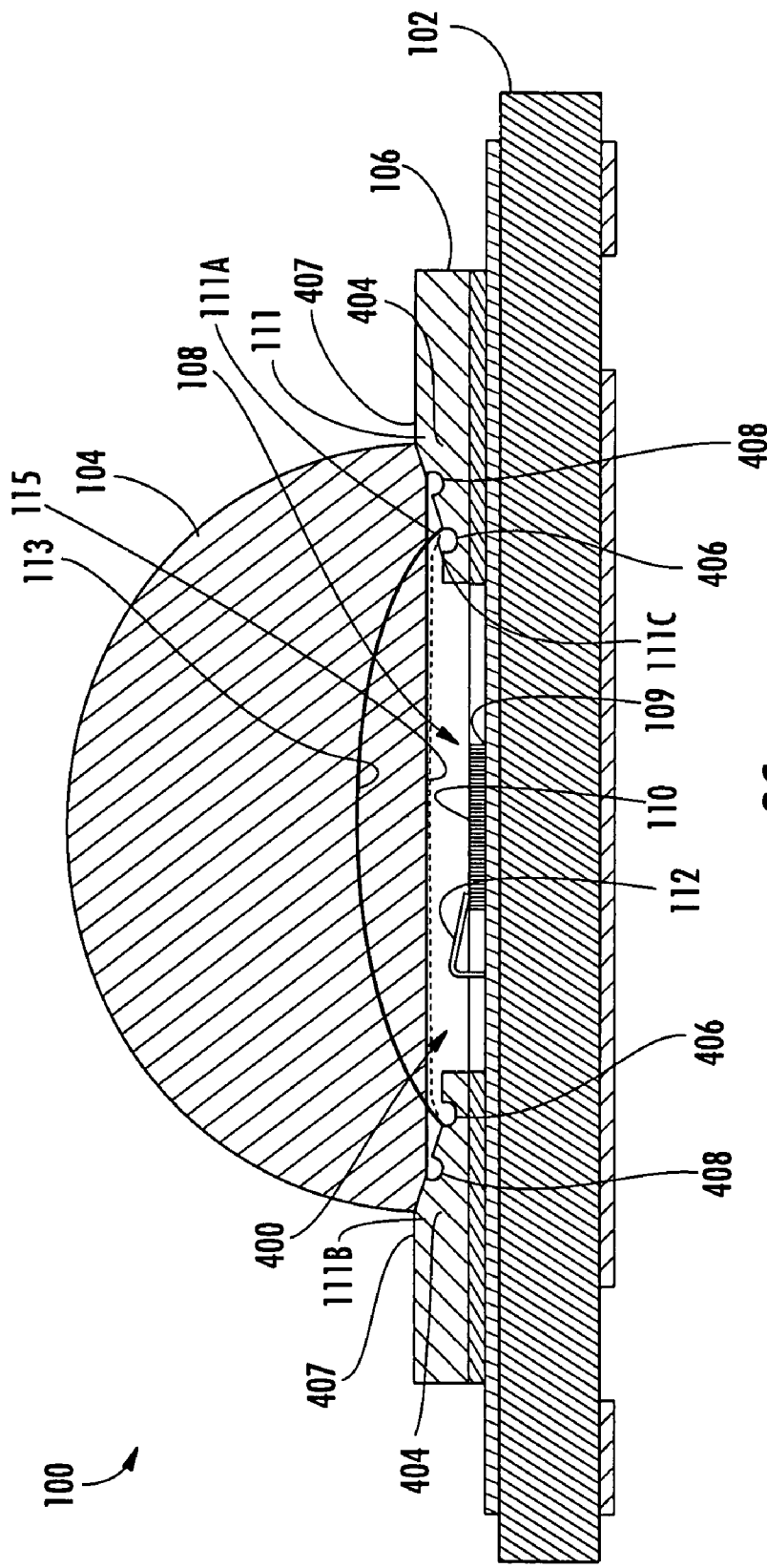
Figure 8D:
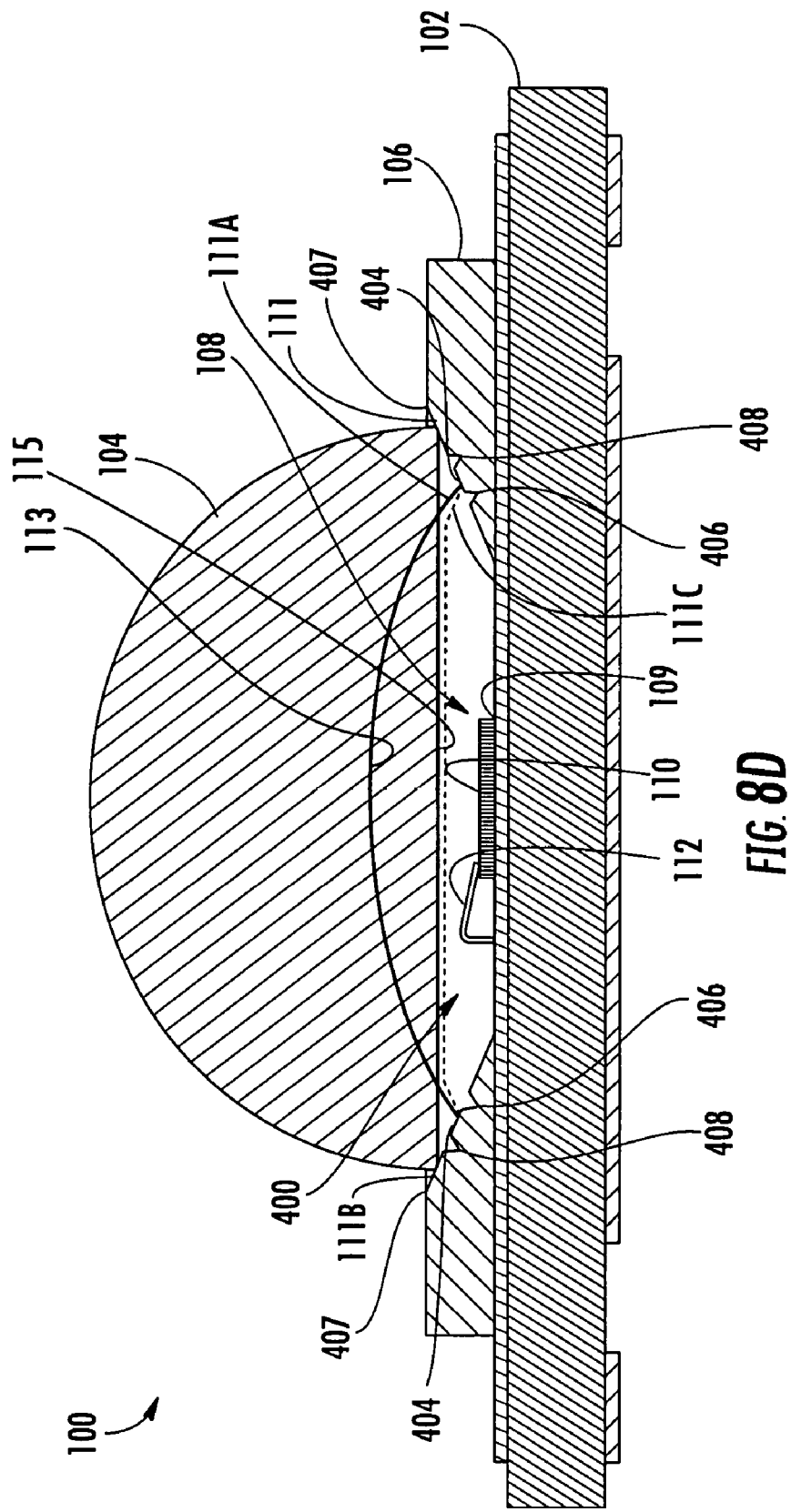
Figure 8E:
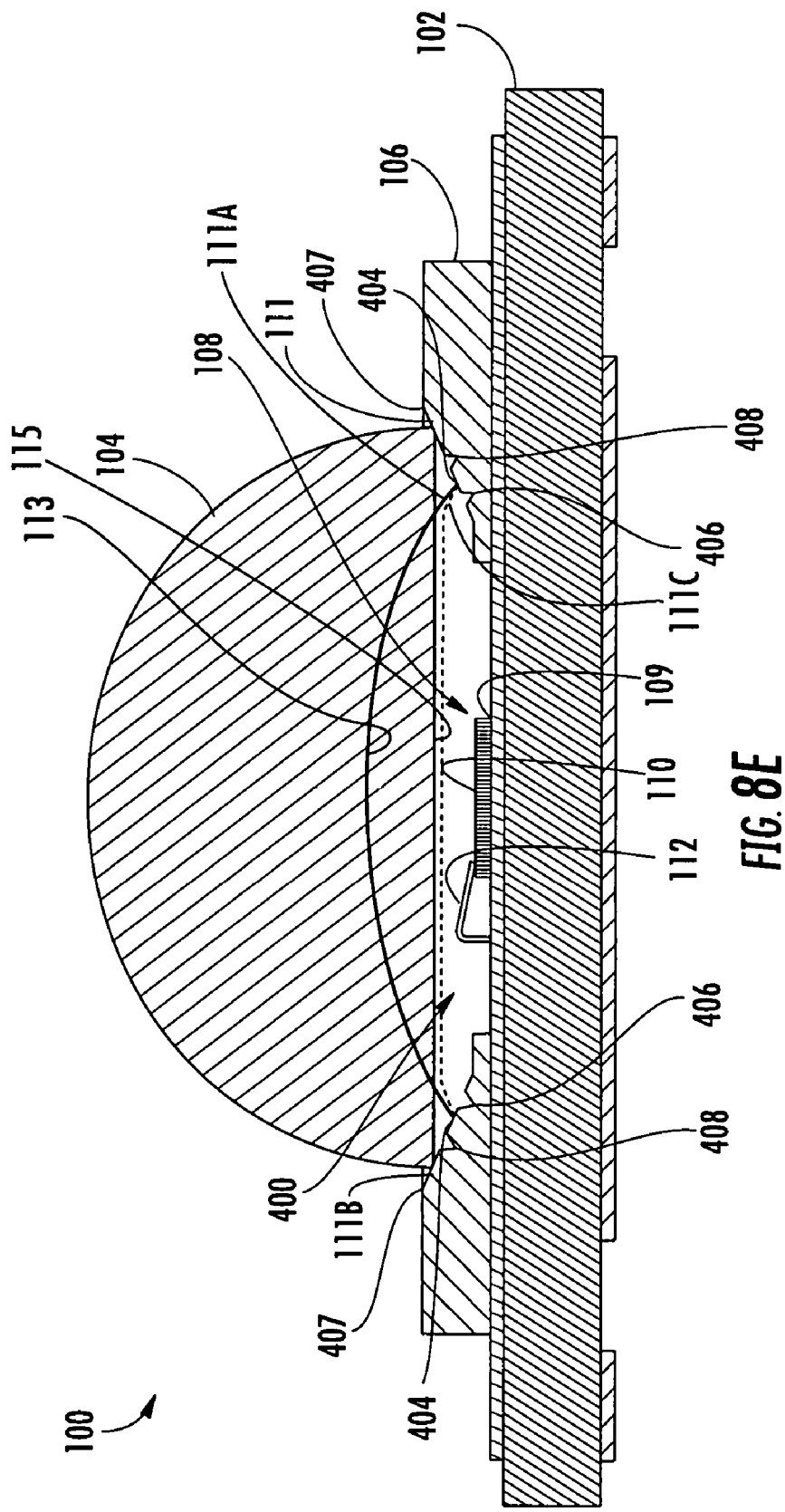

Referring to FIGS. 8C-8E, at least a portion of ledge surface 404 is inclined with respect to the top surface of substrate 102. Referring particularly to FIG. 8C, surface 404 includes a portion 404a that is substantially parallel to the top surface of substrate 102. Depressions 406 are formed in surface portion 404a. Surface 404 also includes a portion 404b that is inclined with respect to the top surface of substrate 102. Depressions 408 are formed in surface portion 404b. As a result, depressions 408 are in a raised position with respect to depressions 406. In this example, depressions 406 and 408 are circular or curved in shape, although the depressions may alternatively be any other suitable shape.

Referring now to FIG. 8D, the entirety of surface 404 is inclined with respect to the top surface of substrate 102. As a result, depressions 408 are in a raised position with respect to depressions 406. Further, depressions 406 and 408 are triangular in shape, although the depressions may alternatively be any other suitable shape.

Referring to FIG. 8E, depressions 406 and 408 are formed in inclined surface portion 404b. As a result, depressions 408 are in a raised position with respect to depressions 406. Further, depressions 406 and 408 are triangular in shape, although the depressions may alternatively be any other suitable shape.

Figure 8F:
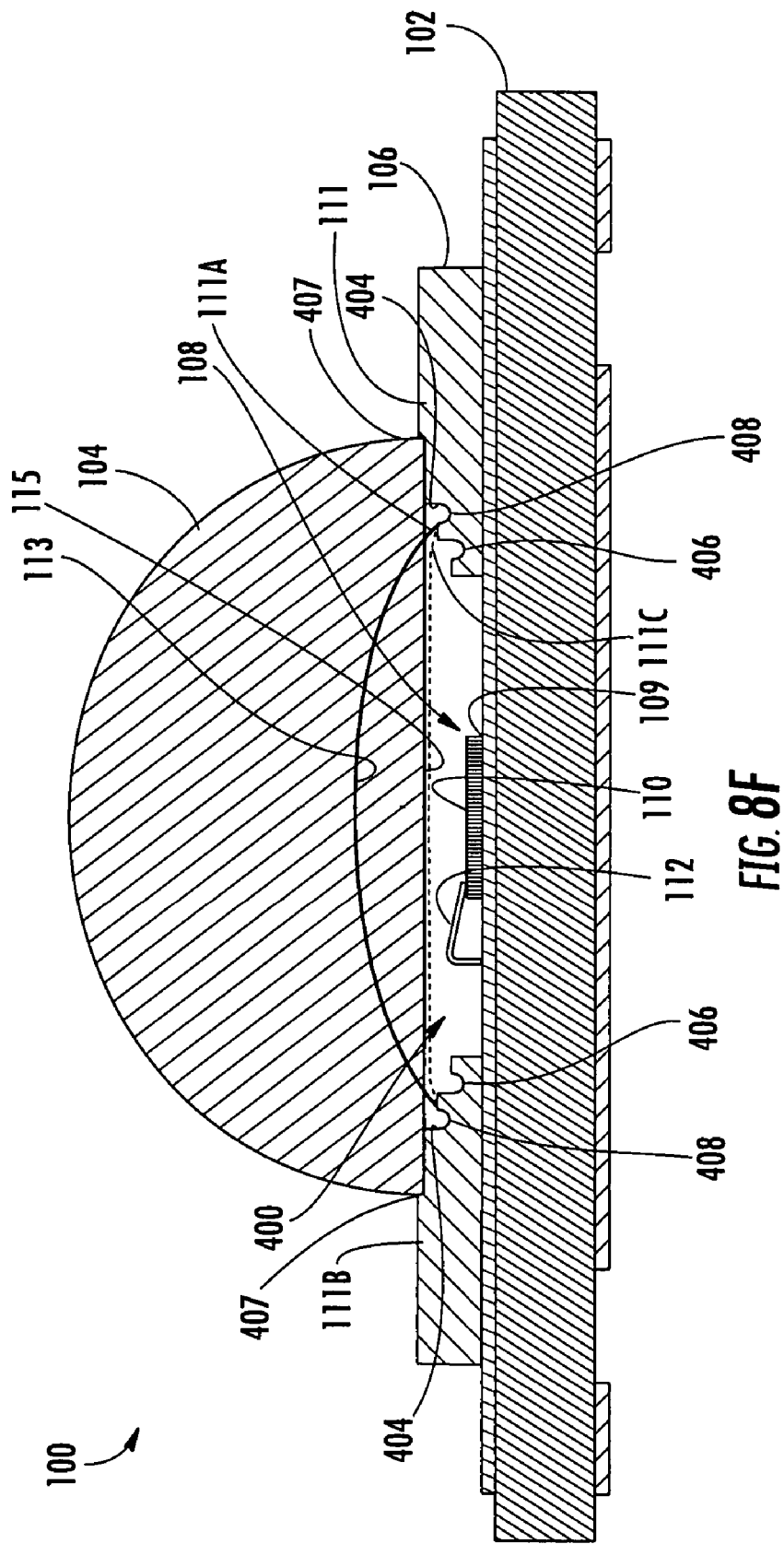

Referring to FIG. 8F, surface 404 includes a stepped structure. Depressions 406 and 408 are formed in different "steps" of surface 404. As a result, depressions 408 are in a raised position with respect to depressions 406. Although depressions 406 and 408 are circular or curved in shape, the depressions may alternatively be any other suitable shape.

Figure 8G:
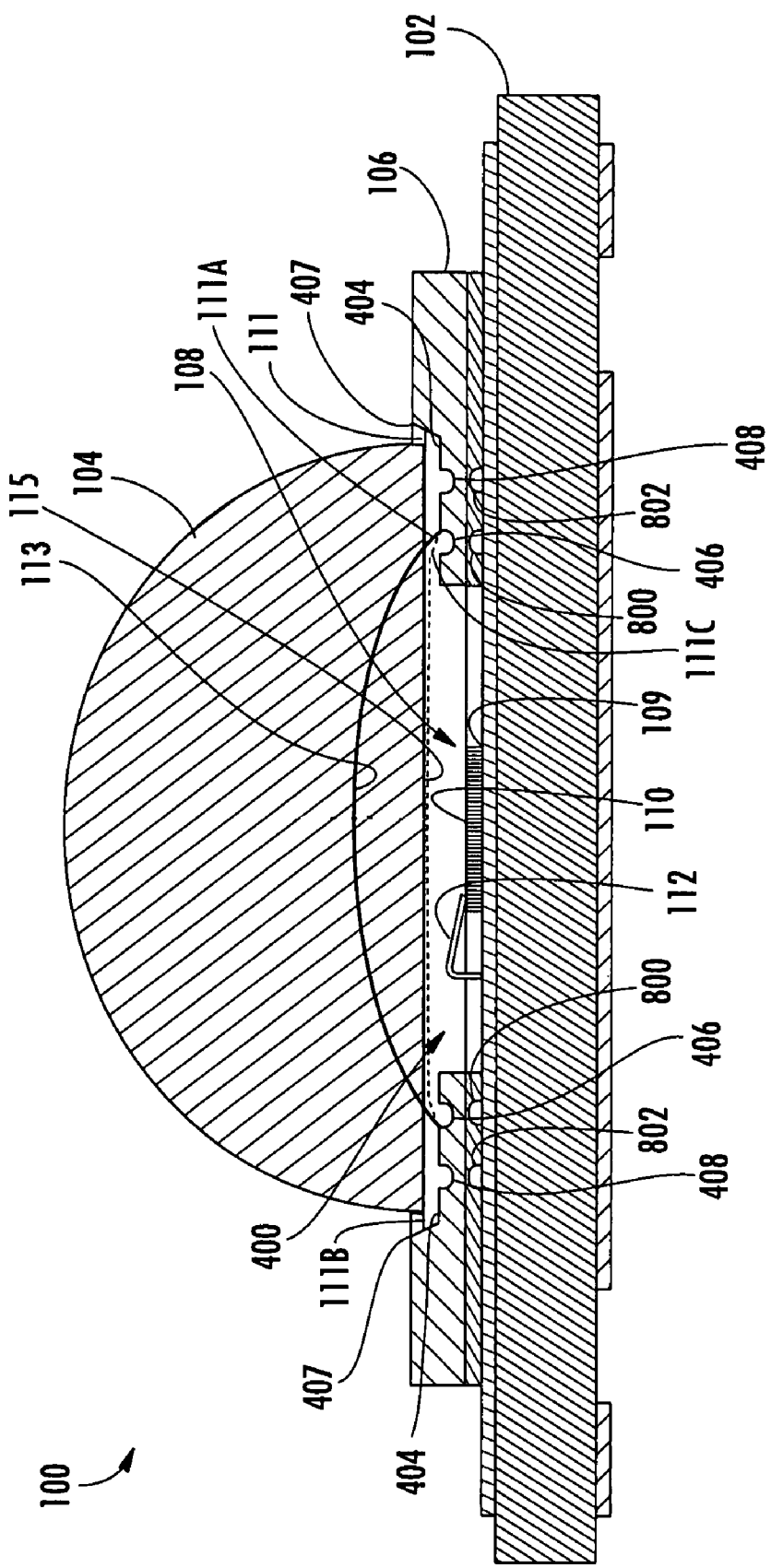

Referring to FIG. 8G, lens coupler 106 includes depressions 800 and 802 formed within an underside of the lens coupler. A suitable encapsulant can be disposed in depressions 800 and 802 for adhering lens coupler 106 to substrate 102. Depressions 800 and 802 may be any suitable shape and size for enclosing the encapsulant.

In an alternative embodiment, a plurality of the light emitting device packages as disclosed herein can be arranged together one or more substrates. Further, the packages can be operably connected to suitable circuitry for providing power and control to the LEDs.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A light emitting device package comprising:
a mounting pad adapted for attachment of a light emitting device;
a lens coupler attached to the mounting pad and defining an opening for containing the light emitting device and a quantity of encapsulant, and wherein the lens coupler includes a surface defining a depression which comprises at least one edge that shapes an outer surface of the encapsulant; and
a lens including a surface that substantially conforms to the shaped outer surface of the encapsulant.

2. The light emitting device package of claim 1 wherein the light emitting device includes a light emitting diode (LED).

3. The light emitting device package of claim 1 wherein the lens coupler comprises one or more reflective surfaces positioned for reflecting light generated by the light emitting device.

4. The light emitting device package of claim 1 wherein the encapsulant is a first encapsulant and comprises a first convex meniscus, and further wherein the surface of the lens coupler includes first and second depressions substantially surrounding an open end of the opening, the first depression forming the at least one edge and being positioned between the second depression and the open end of the opening, and the second depression shapes a second convex meniscus of a second encapsulant.

5. The light emitting device package of claim 4 wherein the second encapsulant is disposed on the first encapsulant.

6. The light emitting device package of claim 5 wherein the lens adheres to the second encapsulant.

7. The light emitting device package of claim 4 wherein the second depression is in a raised position with respect to the first depression.

8. The light emitting device package of claim 7 wherein the first and second depressions are positioned on first and second portions of the surface, the second portion being in a raised position with respect to the first portion.

9. The light emitting device package of claim 1 wherein the surface of the lens is concave.

10. The light emitting device package of claim 1 comprising a substrate attached to the mounting pad, and wherein the depression is a first depression, and wherein the lens coupler comprises a second depression formed in an underside surface of the lens coupler to enclose encapsulant for adhering the lens coupler to the substrate.

11. A method of forming a light emitting device package, the method comprising:
providing a mounting pad adapted for attachment of a light emitting device;
attaching a lens coupler to the mounting pad, the lens coupler defining an opening for containing the light emitting device, wherein the lens coupler includes a surface defining a depression which comprises at least one edge;
depositing encapsulant in the opening such that the at least one edge of the surface shapes an outer surface of the encapsulant; and
positioning a lens to substantially enclose the opening and to interface with the encapsulant, wherein the lens includes surface that substantially conforms to the shaped outer surface of the encapsulant.

12. The method of claim 11 wherein the lens coupler comprises one or more reflective surfaces positioned for reflecting light generated by the light emitting device.

13. The method of claim 11 wherein the encapsulant is a first encapsulant and comprises a first convex meniscus, and further wherein the surface of the lens coupler includes first and second depressions substantially surrounding an open end of the opening, the first depression forming the at least one edge and being positioned between the second depression and the open end of the opening, and
the method comprising:
at least partially curing the first encapsulant; and
depositing a second encapsulant on the first encapsulant such that the second depression shapes the second encapsulant to have a second convex meniscus.

14. The method of claim 13 wherein the lens adheres to the second encapsulant.

15. The method of claim 13 wherein the second depression is in a raised position with respect to the first depression.

16. The method of claim 15 wherein the first and second depressions are positioned on first and second portions of the surface, the second portion being in a raised position with respect to the first portion.

17. The method of claim 11 wherein the surface of the lens is concave.

18. The method of claim 11 comprising a substrate attached to the mounting pad, and wherein the depression is a first depression, and wherein the lens coupler comprises a second depression formed in an underside surface of the lens coupler to enclose encapsulant for adhering the lens coupler to the substrate.

19. A light emitting diode (LED) package comprising:
a substrate including a mounting pad;
an LED attached to the mounting pad;
a lens coupler attached to the mounting pad and defining an opening for containing the LED and a first quantity of encapsulant, wherein the lens coupler includes at least one surface defining a first depression which comprises a first edge that shapes an outer surface of the first quantity of encapsulant, and wherein the at least one surface defines a second depression which comprises a second edge that substantially surrounds the first edge and that shapes an outer surface of a second quantity of encapsulant, wherein the first quantity of encapsulant is positioned between the LED and the second quantity of encapsulant; and
a lens positioned to substantially enclose the opening and to interface with the first and second encapsulants, wherein the lens includes surface that substantially conforms to the shaped outer surface of the first quantity of encapsulant.

20. The LED package of claim 19 wherein the lens coupler comprises one or more reflective surfaces positioned for reflecting light generated by the light emitting device.

21. The LED package of claim 19 wherein the first depression is positioned between the second depression and the open end of the opening.

22. The LED package of claim 21 wherein the first and second depressions each substantially surround the open end of the opening.

23. The LED package of claim 19 wherein the surface of the lens is concave.

24. A method of forming a light emitting diode (LED) package, the method comprising:

providing a substrate including a mounting pad;

attaching an LED to the mounting pad;

attaching a lens coupler to the mounting pad, the lens coupler defining an opening for containing the LED, wherein the lens coupler includes at least one surface defining a first depression which comprises a first edge, and wherein the at least one surface defines a second depression which comprises a second edge that substantially surrounds the first edge;

depositing a first quantity of encapsulant in the opening such that the first edge of the surface shapes an outer surface of the first quantity of encapsulant;

depositing a second quantity of encapsulant on the first quantity of encapsulant such that the second edge of the surface shapes an outer surface of the second quantity of encapsulant, wherein the first quantity of encapsulant is positioned between the LED and the second quantity of encapsulant; and positioning a lens to substantially enclose the opening and to interface with the second quantity of encapsulant, wherein the lens includes surface that substantially conforms to the shaped outer surface of the first quantity of encapsulant.

25. The method of claim 24 wherein the surface of the lens is concave.

* * * * *